United States Patent [19]

Siligoni et al.

[11] Patent Number: 4,661,780
[45] Date of Patent: Apr. 28, 1987

[54] DIFFERENTIAL STAGE PARTICULARLY FOR ACTIVE FILTERS

[75] Inventors: Marco Siligoni, Vittuone; Bruno Murari, Monza, both of Italy

[73] Assignee: IS-ATES Componenti Elettronici S.p.A., Catania, Italy

[21] Appl. No.: 612,486

[22] Filed: May 21, 1984

[30] Foreign Application Priority Data

Jun. 3, 1983 [IT] Italy ................................ 21457 A/83

[51] Int. Cl.$^4$ ............................................. H03F 3/45
[52] U.S. Cl. .................... 330/254; 330/257; 330/311
[58] Field of Search ............... 330/254, 257, 275, 301, 330/311

[56] References Cited

U.S. PATENT DOCUMENTS 3,873,933   3/1975   Wheatley, Jr. .................... 330/257
4,274,061   6/1981   Kraemer .......................... 330/257 X
4,464,632   8/1984   Yoshihisa et al. ................. 330/254

FOREIGN PATENT DOCUMENTS 2943012   5/1980   Fed. Rep. of Germany .

OTHER PUBLICATIONS

Reimer, "Rauscharme Operationsverstärker Orschlieben Neue Anwendungen", *Electronik* 21, Oct. 23, 1981, pp. 71–78.
Voorman et al., "Integration of Anawg Filters in a Bipolar Process", Journal of Solid State Circuits, vol SC-17, No. 4, Aug. 1982, pp. 713, 714, 716–722.

*Primary Examiner*—James B. Mullins
*Attorney, Agent, or Firm*—Guido Modiano; Albert Josif

[57] ABSTRACT

Differential stage comprising a high input dynamic range differential circuit formed by first and second transistors whose emitter electrodes are connected together and to a constant current source through respective resistors, their base electrodes having an input signal applied thereto, and their collector electrodes supplying respective collector currents. The stage further comprises a dual-single converter circuit receiving the collector currents at its input and supplying a stage output current, said converter circuit including at least one variable current source and having a conversion factor which varies as a function of the variable source current.

3 Claims, 5 Drawing Figures

DIFFERENTIAL STAGE PARTICULARLY FOR ACTIVE FILTERS

BACKGROUND OF THE INVENTION

This invention relates to an improved differential stage particularly for active filters.

As is known, active filters utilize differential stages which are required to simultaneously have a high input dynamic range and the ability to change the stage transconductance (i.e., the ratio of output current to input differential voltage). However, it has been impossible, heretofore, to meet both of these requirements with prior circuits, and more generally, it has not been possible to achieve a high input dynamic range in circuits featuring a variable transconductance, while circuits having a higher input dynamic range could not provide variability of transconductance.

In particular, prior circuits may be, among other things, referred to two basic schemes, respectively as shown in FIGS. 1 and 3.

In the circuit of FIG. 1, including two transistors whose emitters are connected together and directly to a source of constant current, a transconductance is obtained which is directly proportional to the generator current.

Thus, defining $$g_m = \frac{i_o}{v_d}$$

if $Q_1 = Q_2$, therefore $$i_1 = i_2 = \frac{v_d}{2r_e} \alpha PNP$$

$$i_o = i_1 + i_2 = \frac{2\alpha PNP}{2 r_e} v_d$$

$$g_m = \frac{i_o}{v_d} = \frac{\alpha PNP}{r_e} \text{ with } r_e = \frac{V_t}{I_o}$$

$$g_m = \frac{\alpha PNP}{V_t} I_o$$

Hence, the stage transconductance is proportional to the imposed current $I_o$ and can be varied by varying the latter.

On the other hand, with this circuit, the maximum input dynamic range (i.e., the maximum differential voltage that may be applied between the bases of the two transistors) is restricted to approximately 3 $V_t$.

In fact, a large signal analysis of the circuit (see, for example, Gray, Meyer "Analysis and Design of Analog Integrated Circuits", John Wiley & Sons, 1977, p. 158 seq.) would give $$i_o = \alpha PNP \, 2I_o \tanh\left(\frac{v_d}{2V_t}\right)$$

the behavior whereof versus the input differential voltage is shown in FIG. 2.

In the circuit of FIG. 3, wherein to increase the input dynamic range, two resistors have been connected serially to the emitter electrodes of the two transistors, while an improvement is achieved in the input dynamic range, variability of transconductance as a function of the imposed current goes lost.

In that case, in fact $$g_m = \frac{i_o}{v_d} = \frac{\alpha PNP}{r_e + R_E} \text{; and if } r_e << R_E \text{ then } g_m = \frac{\alpha PNP}{R_E}$$

while the input dynamic range is linear with the current $I_o$ $$v_{dMAX} \approx 2I_o R_E$$

SUMMARY OF THE INVENTION

In view of the above-outlined situation, it is a primary object of this invention to provide a differential stage particularly for active filters, which can combine an adjustable gain with high input dynamic range characteristics.

A further object of the invention is to provide a differential stage as indicated, which is simple, relatively inexpensive, and comprised of readily integrated components.

These and other objects, such as will be apparent hereinafter, are achieved by an improved differential stage particularly for active filters, according to the invention, comprising a high input dynamic range differential circuit including first and second transistors provided with respective collector, emitter, and base electrodes, said emitter electrodes being connected together and to a constant current source through respective emitter resistors, said base electrodes having an input signal applied thereto, and said collector electrodes supplying respective collector currents, a dual-single converter circuit being provided, receiving said collector currents at the input thereof and supplying a stage output current, said dual-single converter circuit having a conversion factor defined as the ratio of said output current to said collector currents, and characterized in that said dual-single converter circuit comprises at least one variable current source and has a conversion factor which is a function of said variable current, thereby, in combination with said differential circuit, it imparts said differential stage with a high dynamic range of the input signal and variable transfer function as the ratio of output current to input signal.

BRIEF DESCRIPTION OF THE DRAWINGS

Further features and advantages of the invention will be more clearly understood from the following description of two preferred embodiments thereof, as illustrated by way of example and not of limitation in the accompanying drawings, where.

DESCRIPTION OF THE PREFERRED EMBODIMENTS

Figure 1:
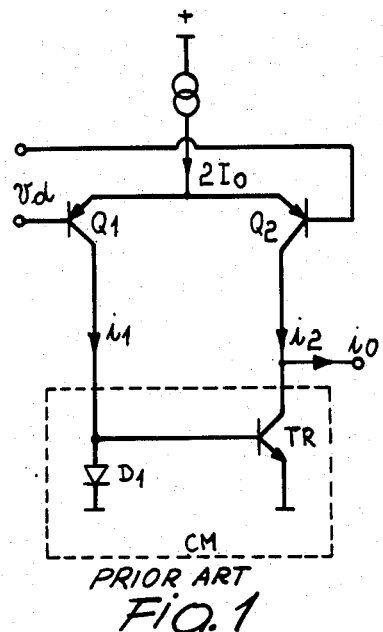
FIG. 1 is a circuit diagram of a prior stage.
Figure 2:
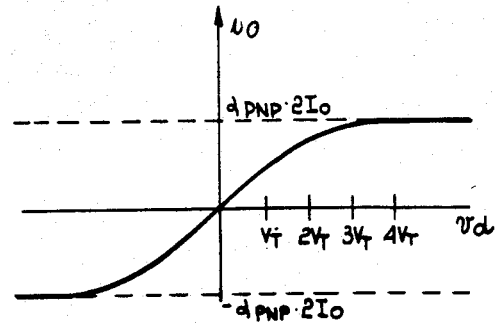
FIG. 2 illustrates the behavior of the output current of the circuit of FIG. 1 versus the input voltage.

Making reference to FIG. 1 of the drawings, the conventional circuit for which currents and voltages have been obtained in the preamble, includes a pair of transistors Q1 and Q2 whose emitters are connected directly together and to a source of constant current $2I_o$, and between the bases whereof the differential input signal $v_d$ is applied.

The two collectors of the transistors are connected to the inputs of a current mirror circuit, indicated at CM, which includes conventionally a transistor TR and diode $D_1$.

Figure 3:
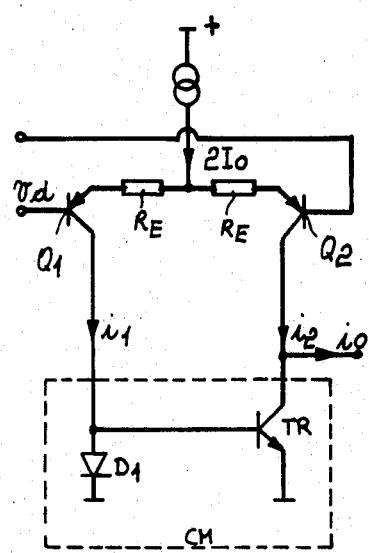
FIG. 3 shows the circuit diagram of another prior differential stage.

The circuit of FIG. 3, the characteristics whereof have also been provided in the preamble, is quite similar to that of FIG. 1, with the difference that connected serially to the emitters of the transistors $Q_1$ and $Q_2$ are two resistors $R_E$ which ensure the high input dynamic range, as explained hereinabove.

Figure 4:
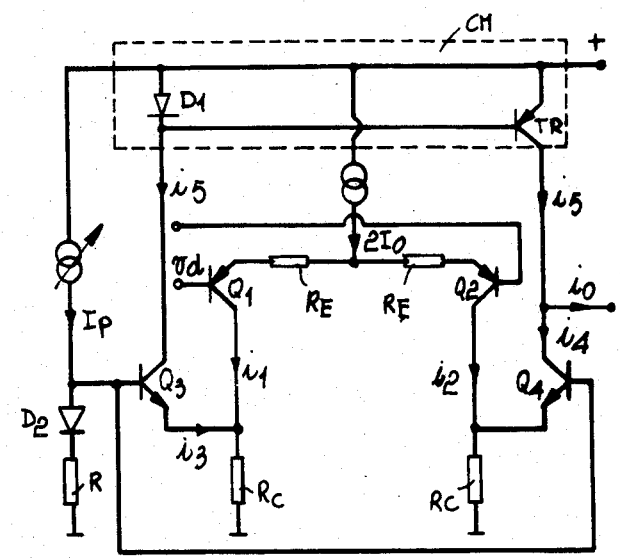
FIG. 4 shows a first embodiment of the stage according to this invention.

Making now reference to FIG. 4, a first embodiment of the differential stage of this invention is shown which, for convenience of illustration, may be regarded as ideally divided into two blocks, a first block comprising the transistors Q1 and Q2 forming a differential amplifier, two resistors $R_E$ in series with the emitters of $Q_1$ and $Q_2$, and constant current source $2I_o$, which has the function of imparting the circuit with a high input dynamic range, and the other block being a cascade-connected block which, by analogy to the previous circuits, will be defined dual-single conversion block (also called single ended circuit) and comprises a semiconductor element having at least first and second terminals end formed in the embodiment shown by transistor Q3, transistor Q4, collector resistors $R_C$, variable current source $I_P$, diode $D_2$ and a further current source including resistor R, and the current mirror circuit CM for changing the circuit transconductance by working on $I_P$. In detail, as visible from FIG. 4, the first embodiment of the stage comprises a first reference potential line (indicated with "+"), a second reference potential line (forming the ground), input terminals (whereto the differential input signal $v_d$ is applied) and an output terminal (feeding an output current $i_o$). Then the constant current source $2I_o$ is connected between the first reference potential line and a tap defined between the two resistors $R_E$, the transistors $Q_1$ and $Q_2$ (having respective collection, base and emitter electrodes) define with their base electrodes the input terminals of the stage and are connected with their collector electrodes to a terminal of the collector resistors $R_E$ which in turn are connected with the other terminals thereof to ground. Transistor Q4 is connected with the emitter to the collector of Q2, with the base to a first terminal of the semiconductor element (here the base of Q3) and with the collector to the stage output terminal and to a terminal of the current mirror $Q_1$ having a further terminal connected to the collector of $Q_3$. Furthermore transistor $Q_3$, forming the said semiconductor element, is connected with a second terminal thereof (forming the emitter electrode) to the collector $Q_1$, while with the base electrode, $Q_3$ is connected also to the variable current source $I_p$ and the anode of $D_2$ in turn connected with the cathode thereof to resistor R. The variable current source $I_p$ is further connected to the first reference potential line. Particularly for the circuit of FIG. 4, the following relations apply:

$$i_1 = i_2 = \frac{v_d \alpha PNP}{2(r_e + R_E)}$$

$$i_3 = \frac{R_c}{R_c + r_{e3}} i_1$$

-continued $$i_5 = i_3\alpha_3 = v_d \frac{\alpha PNP}{2(r_e + R_E)} \times \frac{R_C \alpha_3}{R_C + r_{e3}}$$

$$i_0 = 2i_5 = v_d \left( \frac{\alpha PNP}{r_e + R_E} \frac{R_C \alpha_3}{R_C + r_{e3}} \right)$$

from which, with $R_E \gg r_e$, $$g_m = \frac{i_o}{V_d} = \frac{\alpha PNP}{R_E} \frac{R_c \alpha_3}{R_c + r_{e3}}$$

Therefore, even where the resistance of the resistors $R_E$ in series with the emitters of the transistor Q1 and Q2 is much greater than the dynamic resistance of the emitters of the transistors themselves ($r_e$), the circuit transconductance, indicated as $g_m$ in the formulae, may be varied by varying the current of the source $I_p$ through the emitter resistance $r_{e3}$ of the transistors Q3 and Q4. This circuit provides a maximum differential voltage of ($V_{d\,max} = 2I_oR_E$), comparable with that of the circuit of FIG. 3.

The essential aspect of the differential stage of this invention resides, however, in substituting, for the dual-single conversion stage with unit transmission factor of prior circuits, a conversion circuit whose transmission factor is dependent on the conductive level of the transistors Q3 and Q4 in accordance with the imposed variable current $I_p$.

Figure 5:
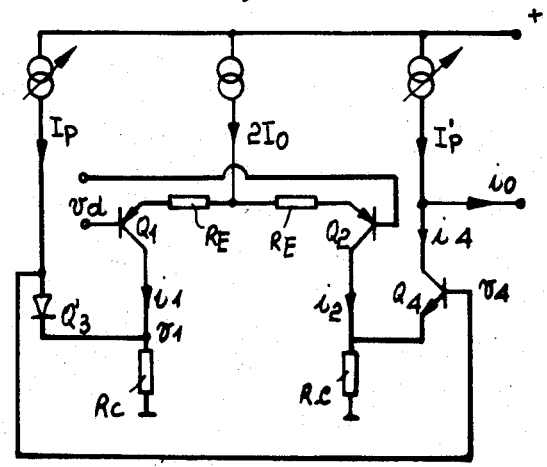
FIG. 5 shows a variation of the differential stage according to the invention.

FIG. 5 illustrates a modified embodiment of the circuit of FIG. 4, which may also be regarded as including a first differential block adapted to determine the stage dynamic range, and a second block having a variable transmission factor and being adapted to control the stage gain.

In this embodiment of the circuit, the differential block again comprises the transistors Q1 and Q2, resistors $R_E$, and constant current source $2I_o$, while the dual-single converter circuit comprises the two resistors $R_C$, transistor Q4 the semiconductor element formed here by, a diode consistently indicated at $Q_3'$, and variable current sources and $I'_p$. In detail in the embodiment according to FIG. 5, the connection of the differential amplifier Q1, Q2, of resistors $R_E$ and $R_c$, of constant current source $2I_o$ and of transistor Q4 are the same as in FIG. 4. In FIG. 5 however, the semiconductor element is formed by the diode, indicated with $Q'_3$ for consistence with FIG. 4, whose first terminal (forming the anode) is again connected to variable current source $I_p$ and the base of Q4 and whose second terminal (cathode) is connected to the collector electrode of $Q_1$. Furthermore instead of current mirror CM here the further current source is formed by the variable current source $I_p$, interposed between the first reference potential line and the collector of $I_4$. In this circuit, the small signal current comprises $i_4$, which may be regarded as the result of adding the current $i'_4$, from the transistor $Q_1$, to $i''_4$ from the transistor $Q_2$.

Solving for the circuit, therefore, $$i_4 = i'_4 + i''_4$$

$$i_1 = \frac{V_d \alpha PNP}{2(r_e + R_E)} = i_2$$

$$v_1 = i_1 R_C = v_4$$

-continued $$i'_4 = \frac{v_4\alpha_4}{R_C + r_{e4}} = \frac{v_d\alpha PNP}{2(r_e + R_E)} \frac{R_C\alpha_4}{R_C + r_{e4}}$$

$$i''_4 = \frac{R_C\alpha_4 i_2}{R_C + r_{e4}} = \frac{v_d\alpha PNP}{2(r_e + R_E)} \frac{R_C\alpha_4}{R_C + r_{e4}}$$

$$i_4 = 2v_d \frac{\alpha PNP}{2(r_e + R_E)} \frac{R_C\alpha_4}{R_C + r_{e4}} = i_o$$

Therefore:

$$g_m = \frac{i_o}{v_d} \simeq \frac{\alpha PNP}{R_E} \frac{R_C\alpha_4}{R_C + r_{e4}} \text{ if } R_E \gg r_e$$

Thus, in this instance, transconductance is equal to that of the previous circuit embodiment, and only conversion from the two collector signals into the output signal changes.

The invention as described in the foregoing is susceptible to many modifications and variations without departing from the true scope of the instant inventive idea; furthermore, all of the details may be replaced with technical equivalents thereof.

We claim:

1. A differential stage particularly for active filters, comprising:
   first and second reference potential lines;
   input and output terminals;
   a constant current source connected to said first reference potential line;
   a differential amplifier including first and second transistors having respective collector, emitter and base electrodes, said base electrodes forming said input terminals;
   first and second resistors connected in series between said emitter electrodes of said first and second transistors and including a tap therebetween connected to said constant current source;
   third and fourth resistors respectively connected between a respective one of said collector electrodes of said first and second transistors and said second reference potential line;
   a single ended circuit including at least a third transistor having collector, emitter and base electrodes, said emitter electrode of said third transistor being connected to said collector electrode of said second transistor, and said collector electrode of said third transistor being connected to said output terminal; a variable current source; having own first and second terminals, said own first terminal of said variable current source being connected to said first reference potential line and said own second terminal of said variable current source being connected to said base electrode of said third transistor; a semicondutctor element having at least first and second terminals, said first terminal of said semiconductor element being connected to said variable current source and said base electrode of said third transistor and said second terminal of said semiconductor element being connected to said collector electrode of said first transistor; and a further current source connected between said first reference potential line and said collector electrode of said third transistor, thereby by varying the current supplied by said variable current source varying at least the dynamic resistence of said third transistor and the differential stage gain.

2. A stage according to claim 1, wherein said further current source comprises a current mirror circuit connected to said first reference potential line and having a first own terminal and a second own terminal and said semiconductor element comprises a fourth transistor having collector, emitter and base electrodes, said collector electrode of said fourth transistor being connected to said first own terminal of said current mirror circuit, said emitter electrode of said fourth transistor forming said second terminal of said semiconductor element and said base electrode of said fourth transistor forming said first terminal of said semiconductor element, and wherein said collector electrode of said third transistor is connected also to said second own terminal of said current mirror circuit.

3. A stage according to claim 1, wherein said further current source is a variable current source and said semiconductor element is a diode having anode and cathode terminals, said anode terminal forming said first terminal of said semiconductor element and said cathode terminal forming said second terminal of said semiconductor element.

* * * * *

UNITED STATES PATENT OFFICE
CERTIFICATE OF CORRECTION

Patent No. 4,661,780　　　　　　　　　Dated APR. 28, 1987

Inventor(s) MARCO SILIGONI - BRUNO MURARI

It is certified that error appears in the above-identified patent and that said Letters Patent are hereby corrected as shown below:

On the Title Page, Item [73] should read:

[73]　Assignee:　SGS-ATES Componenti Elettronici
　　　　　　　　　S.p.A., Catania, Italy

Signed and Sealed this

Thirty-first Day of May, 1988

Attest:

DONALD J. QUIGG

*Attesting Officer*　　　　*Commissioner of Patents and Trademarks*